United States Patent
Yang

(10) Patent No.: US 9,646,696 B2
(45) Date of Patent: May 9, 2017

(54) SEMICONDUCTOR MEMORY DEVICE, ERASING METHODS THEREOF, AND DATA STORAGE DEVICE INCLUDING THE SAME

(71) Applicant: SK hynix Inc., Gyeonggi-do (KR)

(72) Inventor: Chan Woo Yang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/056,721

(22) Filed: Feb. 29, 2016

(65) Prior Publication Data
US 2017/0092372 A1 Mar. 30, 2017

(30) Foreign Application Priority Data
Sep. 25, 2015 (KR) .................... 10-2015-0136368

(51) Int. Cl.
| | |
|---|---|
| G11C 16/04 | (2006.01) |
| G11C 16/34 | (2006.01) |
| G11C 16/16 | (2006.01) |
| G11C 16/06 | (2006.01) |
| G11C 11/34 | (2006.01) |

(52) U.S. Cl.
CPC .............. *G11C 16/04* (2013.01); *G11C 16/06* (2013.01); *G11C 16/16* (2013.01); *G11C 16/3445* (2013.01); *G11C 11/34* (2013.01); *G11C 16/34* (2013.01)

(58) Field of Classification Search
CPC ........................... G11C 16/3445; G11C 16/16
See application file for complete search history.

(56) References Cited

U.S. PATENT DOCUMENTS

| | | | | |
|---|---|---|---|---|
| 8,379,445 B2 * | 2/2013 | Shibata | ............... | G11C 11/5635 365/185.03 |
| 9,390,808 B1 * | 7/2016 | Kato | .................. | G11C 16/3445 |
| 2007/0058446 A1 * | 3/2007 | Hwang | ............... | G11C 11/5628 365/185.29 |
| 2012/0206972 A1 * | 8/2012 | Shiino | .................... | G11C 16/16 365/185.19 |
| 2012/0206976 A1 | 8/2012 | Aoki et al. | | |
| 2012/0224427 A1 | 9/2012 | Takekida | | |
| 2014/0226407 A1 * | 8/2014 | Izumi | ................. | G11C 16/3445 365/185.17 |

FOREIGN PATENT DOCUMENTS

KR 1020080069498 7/2008

* cited by examiner

*Primary Examiner* — Richard Elms
*Assistant Examiner* — Ajay Ojha
(74) *Attorney, Agent, or Firm* — IP & T Group LLP

(57) ABSTRACT

A semiconductor device includes a memory block including a plurality of memory cells coupled with a plurality of corresponding word lines, and a peripheral circuit suitable for performing a first erase verify operation for the plurality of word lines, and a second erase verify operation for one or more weak word lines among the plurality of word lines based on a result of the first erase verify operation.

17 Claims, 8 Drawing Sheets

SEMICONDUCTOR MEMORY DEVICE, ERASING METHODS THEREOF, AND DATA STORAGE DEVICE INCLUDING THE SAME

CROSS-REFERENCES TO RELATED APPLICATION

The present application claims priority under 35 U.S.C. §119(a) to Korean application number 10-2015-0136368, filed on Sep. 25, 2015, in the Korean Intellectual Property Office, which is incorporated herein by reference in its entirety.

BACKGROUND

1. Technical Field

Various embodiments generally relate to a semiconductor device, and more particularly, to a semiconductor memory device capable of storing data.

2. Related Art

Semiconductor memory devices may be employed to store data. The semiconductor memory devices may be divided into nonvolatile and volatile memory devices.

Nonvolatile memory devices maintain data stored therein even though power is cut off. Examples of nonvolatile memory devices include flash memory devices such as NAND or NOR flash memory devices, Ferroelectrics Random Access Memory (FeRAM), Phase-Change Random Access Memory (PCRAM), Magnetoresistive Random Access Memory (MRAM) or Resistive Random Access Memory (ReRAM).

Volatile memory devices do not maintain stored data when power is cut off. Examples of volatile memory devices include Static Random Access Memory (SRAM) and Dynamic Random Access Memory (DRAM).

SUMMARY

In an embodiment, a semiconductor device may include a memory block including a plurality of memory cells coupled with a plurality of corresponding word lines, and a peripheral circuit suitable for performing a first erase verify operation for the plurality of word lines, and a second erase verify operation for one or more weak word lines among the plurality of word lines based on a result of the first erase verify operation.

In an embodiment, a method for operating a semiconductor device including a memory block including a plurality of memory cells may include performing a first erase verify operation for a plurality of word lines coupled to the plurality of corresponding memory cells, and performing a second erase verify operation for one or more weak word lines among the plurality of word lines based on a result of the first erase verify operation.

In an embodiment, a data storage device may include a nonvolatile memory device including a plurality of memory blocks and a peripheral circuit, each of the memory blocks including a plurality of memory cells which are coupled with a plurality of corresponding word lines, and a controller suitable for transmitting an erase command for a memory block selected among the memory blocks, to the nonvolatile memory device, wherein, in response to the erase command, the peripheral circuit performs an erase operation for the selected memory block, performs a first erase verify operation for the plurality of word lines of the selected memory block, and performs a second erase verify operation for one or more weak word lines of the selected memory block based on a result of the first erase verify operation.

DETAILED DESCRIPTION

Figure 1:
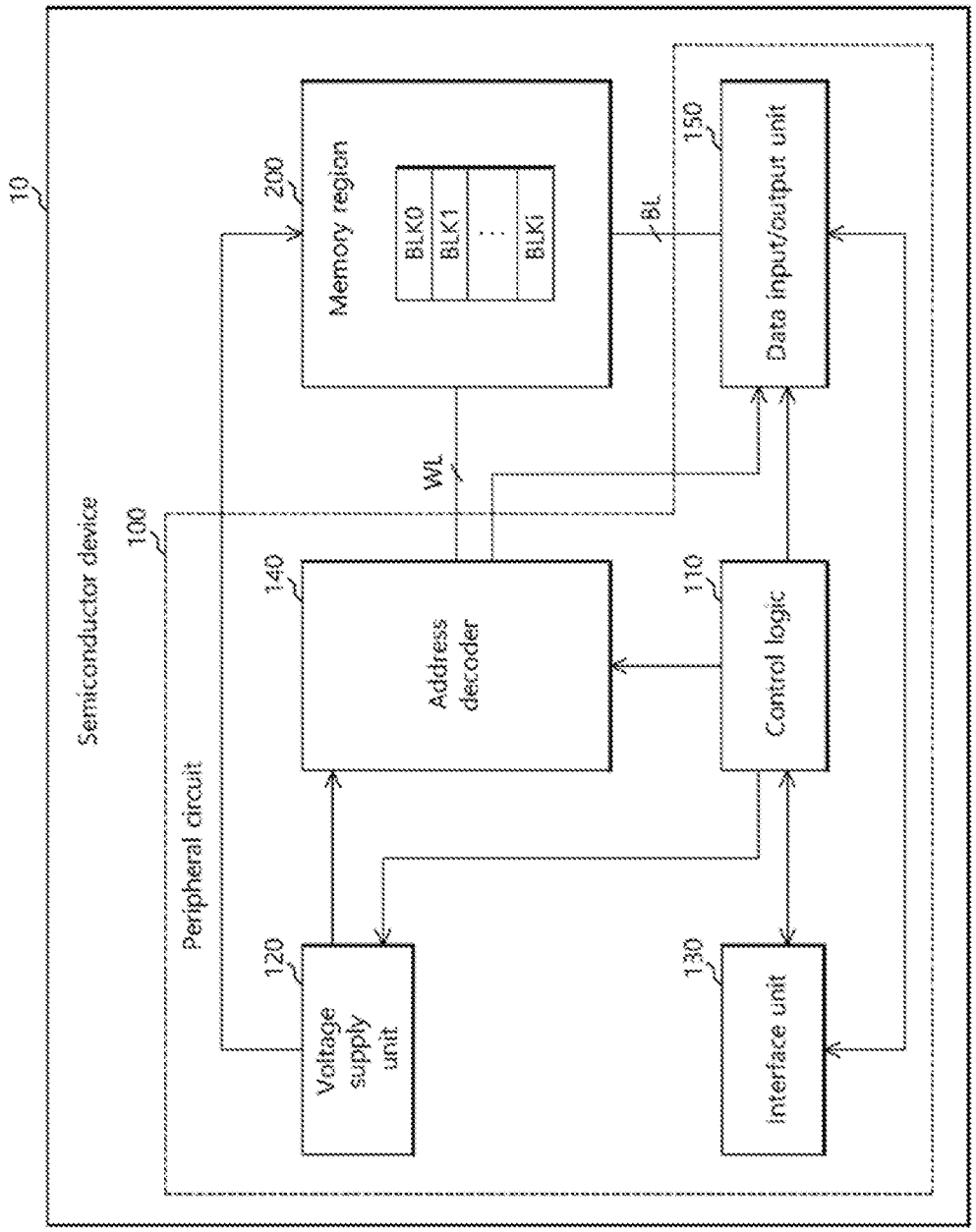
FIG. 1 is a block diagram illustrating a semiconductor device 10, according to an embodiment of the invention.

Hereinafter, various embodiments of the invention will be described with reference to the accompanying drawings. The present invention may, however, be embodied in different forms and should not be construed as being limited to the embodiments set forth herein. Rather, these embodiments are provided to describe the present invention for example to allow a person skilled in the art to which the invention pertains to practice the present invention.

Moreover, it is to be understood that embodiments of the present invention are not limited to the particulars shown in the drawings, that the drawings are not necessarily to scale and, in some instances, proportions may have been exaggerated in order to more clearly depict certain features of the invention. While particular terminology is employed, it is to be appreciated that the terminology employed is for describing particular embodiments only and is not intended to limit the scope of the present invention.

Referring now to FIG. 1 a semiconductor device 10 is provided, according to an embodiment of the invention. The semiconductor device 10 may be or comprise a nonvolatile memory device. The semiconductor device 10 may be or comprise a flash memory, such as NAND or NOR flash memory, a Ferroelectrics Random Access Memory (FeRAM), a Phase-Change Random Access Memory (PCRAM), a Magnetoresistive Random Access Memory (MRAM), a Resistive Random Access Memory (ReRAM), and the like. The nonvolatile memory device 200 may store data transmitted from an external device (not shown) and read the stored data and transmit the read data to the external device, under the control of the external device.

The semiconductor device 10 may include a peripheral circuit 100 and a memory region 200.

After performing an erase operation for a memory block selected among memory blocks BLK0 to BLKi of the memory region 200, the peripheral circuit 100 may perform an erase verify operation for word lines corresponding to the selected memory block to verify whether to complete the erase operation. The peripheral circuit 100 may perform an additional erase verify operation for one or more weak word lines among the word lines based on the result of the erase verify operation. A weak word line may be set based on the sequence of write operations performed on the word lines of the memory block, i.e., the write sequence of the word lines.

For example, when performing an erase verify operation, the peripheral circuit 100 may apply a verify voltage substantially simultaneously to all of the word lines corresponding to a selected memory block, and may determine whether any memory cells coupled to the word lines have threshold voltages lower than the verify voltage. When it is determined that all of memory cells coupled to all of the word lines have threshold voltages lower than the verify voltage, the peripheral circuit 100 may determine that the result of the erase verify operation is a pass and may then perform an additional erase verify operation. For example, when performing an additional erase verify operation, the peripheral circuit 100 may apply an additional verify voltage to the weak word line, apply a pass voltage to remaining word lines except the weak word line and determine whether memory cells coupled to the weak word line have threshold voltages lower than the additional verify voltage. When performing the additional erase verify operation, the peripheral circuit 100 may use an additional verify voltage having a higher level than the verify voltage employed in the erase verify operation. When it is determined that the memory cells coupled to the weak word line have threshold voltages lower than the additional verify voltage, the peripheral circuit 100 may determine that the result of the additional erase verify operation is a 'pass', and may end the verify operation. When the result of the erase verify operation or the additional erase verify operation is a 'fail', the peripheral circuit 100 may repeat the erase operation for the selected memory block.

The peripheral circuit 100 may include a control logic 110, a voltage supply unit 120, an interface unit 130, an address decoder 140, and a data input/output unit 150.

The control logic 110 may control internal units of the semiconductor device 10 such that general operations of the semiconductor device 10 including a write operation, a read operation, an erase operation, an erase verify operation and an additional erase verify operation are performed under the control of the external device. For example, the control logic 110 may control the internal units such that the erase operation, the erase verify operation and the additional erase verify operation are performed, in response to an erase command transmitted from an external device, and may transmit a performance result to the external device.

The voltage supply unit 120 may generate various operation voltages necessary for the general operations of the semiconductor device 10, under the control of the control logic 110. For example, when an erase operation is performed, the voltage supply unit 120 may supply an erase voltage to the memory region 200, and supply an erase enablement/permission voltage to the address decoder 140.

For example, when an erase verify operation is performed, the voltage supply unit 120 may supply a verify voltage to the address decoder 140. For example, when an additional erase verify operation is performed, the voltage supply unit 120 may supply an additional verify voltage and the pass voltage to the address decoder 140.

The interface unit 130 may exchange various kinds of control signals including commands and addresses and data, with the external device. The interface unit 130 may transmit the various kinds of control signals and the data inputted thereto, to the Internal units of the semiconductor device 10.

The address decoder 140 may decode row addresses and column addresses to select portions/places to be accessed in the memory region 200. The address decoder 140 may selectively drive word lines WL and may control the data input/output unit 150 such that bit lines BL are selectively driven, based on decoding results. For an erase operation, an erase verify operation or an additional erase verify operation, the address decoder 140 may apply an erase permission voltage, a verify voltage, or an additional verify voltage and a pass voltage, respectively, to selected word lines WL under the control of the control logic 110.

The data input/output unit 150 may transmit data inputted from the interface unit 130, to the memory region 200 through the bit lines BL. The data input/output unit 150 may transmit data read from the memory region 200 through the bit lines BL, to the interface unit 130.

The memory region 200 may be coupled with the address decoder 140 through the word lines WL, and may be coupled with the data input/output unit 150 through the bit lines BL. The memory region 200 may include a plurality of memory cells which are respectively disposed at crossing areas of the word lines WL and the bit lines BL and store data. The memory region 200 may include a plurality of memory blocks BLK0 to BLKi each of which includes a plurality of memory cells. The memory blocks BLK0 to BLKi may include memory cell arrays of a two-dimensional or three-dimensional structure. An erase operation may be performed on a memory block basis.

Figure 2:
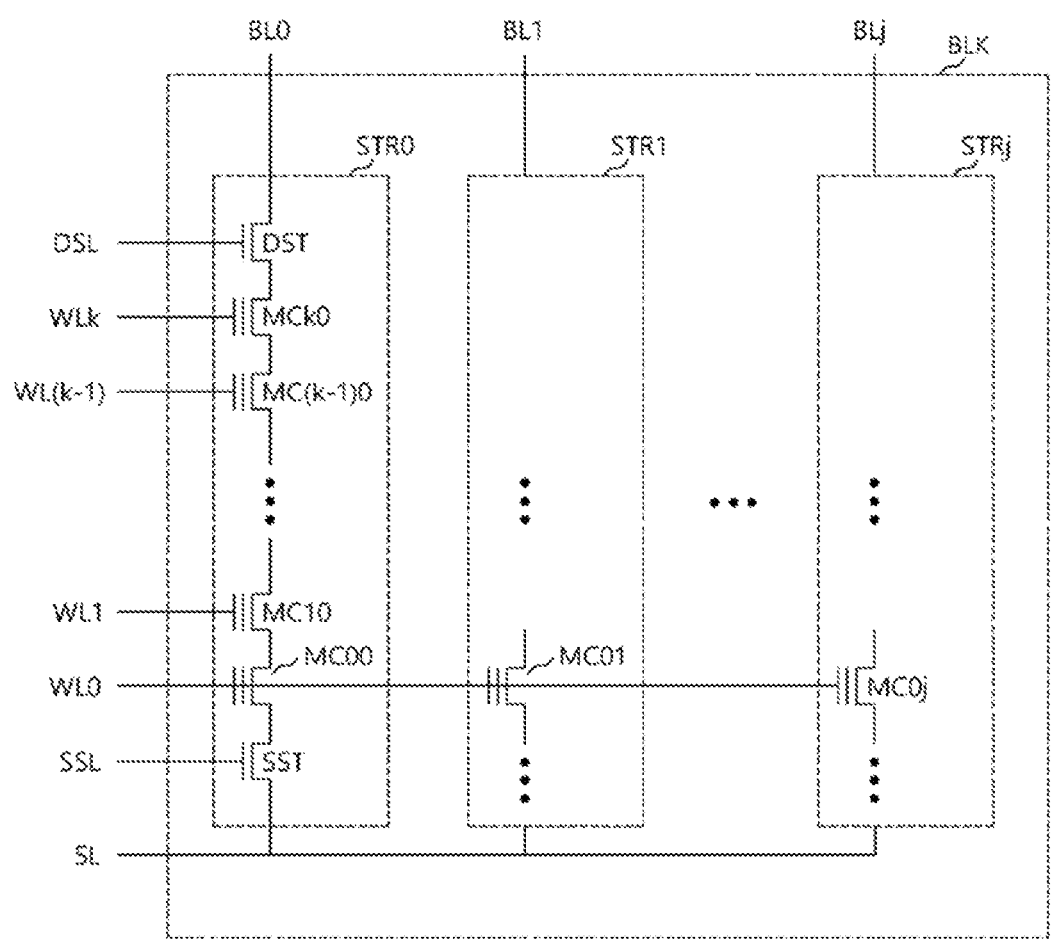
FIG. 2 is a diagram illustrating a memory block BLK of a semiconductor device, according to an embodiment of the invention.

FIG. 2 is a diagram illustrating an example of a memory block BLK according to an embodiment of the invention. The memory blocks BLK0 to BLKi shown in FIG. 1 may be configured in substantially the same way as the memory block BLK.

The memory block BLK may include strings STR0 to STRj. Each of the strings STR0 to STRj may be coupled between a common source line SL and a corresponding bit line. For example, the string STR0 may be coupled between the common source line SL and a bit line BL0.

The strings STR1 to STRj may be configured in substantially the same way as the string STR0 and, therefore, only the architecture of string STR0 will be described herein as an example. The string STR0 may include a drain select transistor DST, memory cells MC00 to MCk0, and a source select transistor SST. The drain select transistor DST may have a drain which is coupled to the bit line BL0 and a gate which is coupled to a drain select line DSL. The source select transistor SST may have a source which is coupled to the source line SL and a gate which is coupled to a source select line SSL. The memory cells MC00 to MCk0 may be coupled in series between the drain select transistor DST and the source select transistor SST. Gates of the memory cells MC00 to MCk0 may be coupled to word lines WL0 to WLk, respectively.

Each of the word lines WL0 to WLk may be coupled to corresponding memory cells of the strings STR0 to STRj. For example, the word line WL0 may be coupled to memory cells MC00 to MC0j which are included in the strings STR0 to STRj, respectively. Memory cells may be written when corresponding word lines are selected in the write operation. The memory cells MC00 to MC0j may be simultaneously written when the word line WL0 is selected in the write operation. The word lines WL0 to WLk may be selected in a predetermined write sequence in the write operation.

Figure 3:
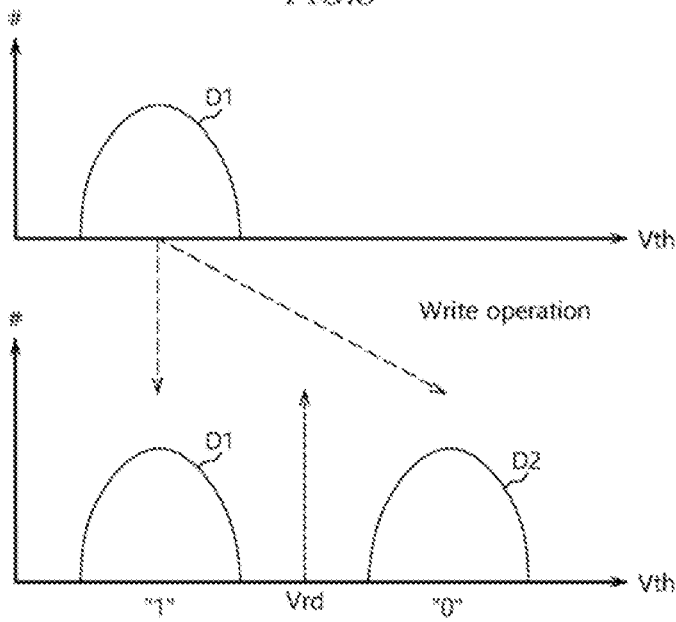
FIG. 3 is a graph illustrating threshold voltage distributions D1 and D2 of memory cells included in the memory block BLK shown in FIG. 2, according to an embodiment of the invention.

Referring now to FIG. 3 examples of threshold voltage distributions D1 and D2 of memory cells included in the memory block BLK shown in FIG. 2 are provided. In the graph of FIG. 3, a horizontal axis Vth is a threshold voltage of a memory cell, while a vertical axis # is the number of memory cells corresponding to a threshold voltage.

Completely erased memory cells may form the threshold voltage distribution D1. Memory cells may form the threshold voltage distributions D1 and D2 depending on data stored therein through the write operation. For example, memory cells storing data "1" may form the threshold voltage distribution D1, and memory cells storing data "0" may form the threshold voltage distribution D2. When the write operation is performed, a memory cell may be controlled to have a predetermined threshold voltage depending on data to be stored.

A memory cell that stores data and has a threshold voltage may be turned on/off depending on its threshold voltage, when a predetermined read voltage Vrd is applied through a corresponding word line. For example, a memory cell having a threshold voltage within the threshold voltage distribution D0 may be turned on when a read voltage Vrd higher than its threshold voltage is applied, and a memory cell which forms the threshold voltage distribution D2 may be turned off when the read voltage Vrd lower than its threshold voltage is applied. A memory cell may be determined to store data "1," when it is turned on in response to the read voltage Vrd, and a memory cell may be determined to store data "0," when it is turned off in response to the read voltage Vrd. For example, a memory cell may produce current as it is turned on/off, and data stored in the memory cell may be determined as the current is sensed.

While FIG. 3 shows 2 threshold voltage distributions D1 and D2 which are formed when 1-bit data is stored in each memory cell, it is to be noted that, according to an embodiment, when plural-bit data is stored in each memory cell, memory cells may form a plurality of threshold voltage distributions depending on data stored therein.

Figure 4:
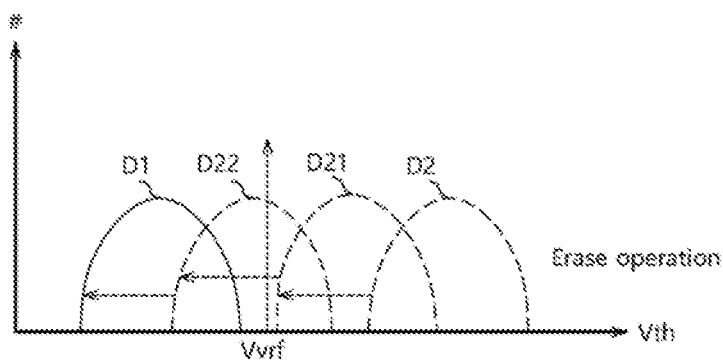
FIG. 4 is a graph illustrating changes in the threshold voltage distributions of the memory cells of FIG. 3 when an erase operation is performed, according to an embodiment of the invention.

FIG. 4 is a graph illustrating changes in the threshold voltage distributions of the memory cells of FIG. 3 when an erase operation is performed.

Figure 5:
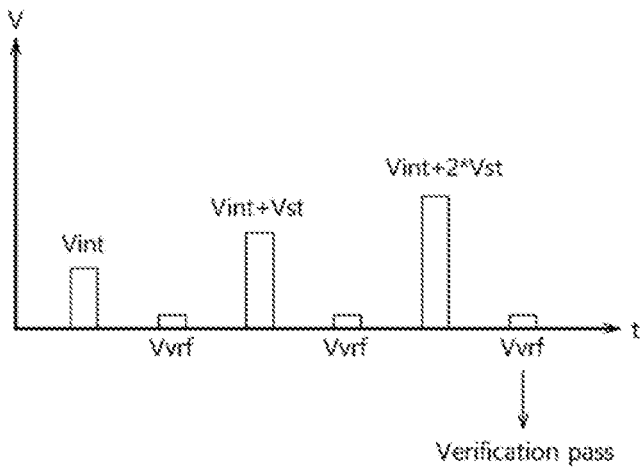
FIG. 5 is a graph illustrating operation voltages employed for an erase operation and an erase verify operation, according to an embodiment of the invention.

FIG. 5 is a graph illustrating operation voltages employed when an erase and an erase verify operations are performed. In the graph of FIG. 5, a horizontal axis t represents time, and a vertical axis V represents voltage.

Hereinbelow, a method for performing an erase operation and an erase verify operation will be described with reference to FIGS. 4 and 5 as an example.

Referring to FIG. 4, completely erased memory cells may have threshold voltages falling within the threshold voltage distribution D1. When an erase operation is performed for the memory block BLK, memory cells with threshold voltages falling within the threshold voltage distribution D2 may be controlled to lower their threshold voltages so that they form the threshold voltage distribution D1. When performing an erase operation, in order to lower the threshold voltages of the memory cells, the peripheral circuit 100 may apply an erase voltage of a high positive level to the well of the memory block BLK, and may apply a predetermined erase permission voltage to the word lines WL0 to WLk of the memory block BLK.

Referring to FIG. 5, an erase operation may be performed according to an increment step pulse erase (ISPE) scheme. For example, the peripheral circuit 100 may start an erase operation by applying an initial erase voltage Vint to the memory block BLK. With each iteration of the erase operation, the peripheral circuit 100 may apply an increased erase voltage to the memory block BLK. For example, with each iteration the erase voltage may be increased by a step voltage Vst from a previous erase voltage. Memory cells of the threshold voltage distribution D2 in the memory block BLK may not be completely erased through one erase operation. For example, the memory cells of the threshold voltage distribution D2 may form threshold voltage distributions D21, D22 and D1, respectively, when erase voltages Vint, Vint+Vst and Vint+2*Vst are applied to the well.

Each time when performing an erase operation for the memory block BLK, the peripheral circuit 100 may also perform an erase verify operation for determining whether the memory cells are completely erased, that is, form the threshold voltage distribution D1. When performing an erase verify operation, the peripheral circuit 100 may apply a verify voltage Vvrf to the word lines WL0 to WLk of the memory block BLK. That is to say, the peripheral circuit 100 may determine whether the memory cells are completely erased, based on the on/off characteristics of the memory cells in response to the verify voltage Vvrf. When threshold voltages of some memory cells are higher than the verify voltage Vvrf, for example, when the memory cells form the threshold voltage distributions D21 and D22, the peripheral circuit 100 may determine that the memory cells are incompletely erased and the result of the erase verify operation is a 'fail'. When the memory cells form the threshold voltage distribution D1, the peripheral circuit 100 may determine that the result of the erase verify operation is a 'pass'. Until it is determined that the result of the erase verify operation is a 'pass' (that is, a verification pass), the peripheral circuit 100 may repeat the erase operation multiple times by increasing the erase voltage each time.

According to an embodiment, the peripheral circuit 100 may iteratively perform an erase operation till a threshold iteration count reached. So for example, in the case where the result of an erase verify operation is a 'fail' and the threshold iteration count has been reached, then the peripheral circuit 100 may end the erase operation and determine that the corresponding memory block BLK may not be employed any more.

Figure 6:
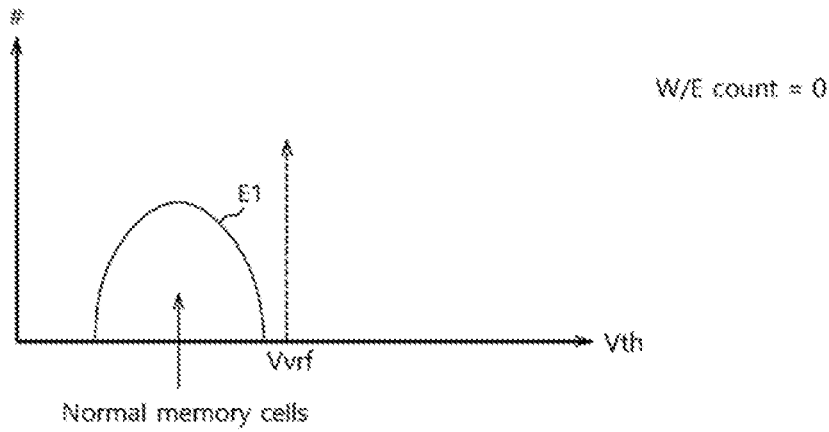
FIG. 6 is a graph illustrating threshold voltage distributions of normal and degraded memory cells, according to an embodiment of the invention.
Figure 6:
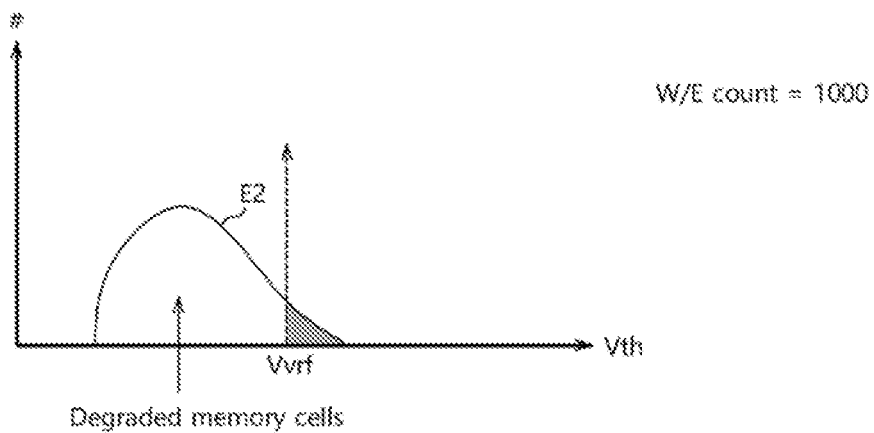

FIG. 6 is a graph illustrating a threshold voltage distribution E1 of normal memory cells and a threshold voltage distribution E2 of degraded memory cells.

Memory cells may be degraded as a use count increases, that is, a write/erase (W/E) count of a memory block increases. Degraded memory cells may be difficult to be erased as compared to normal memory cells, i.e., memory cells that have not been degraded. For example, normal memory cells of which the W/E count is "0" may form the threshold voltage distribution E1 as they are completely erased when the erase operation is iteratively performed by a predetermined iteration count. However, degraded memory cells of which the W/E count is "1000" may form the threshold voltage distribution E2 as they are incompletely erased when the erase operation is iteratively performed by the same iteration count.

Because memory cells which are employed more than other memory cells included in the same memory block BLK may be degraded more seriously and be difficult to be erased, they may form a shaded portion in the threshold voltage distribution E2. For example, because the memory cells included in the memory block BLK may not be wholly written but partially written and then erased, actual use counts may be different even though the memory cells are included in the same memory block BLK. Memory cells, which are coupled to a word line with a higher priority in a write sequence, for example, the word line WL0, may be degraded more seriously than memory cells, which are coupled to a word line with a lower priority in the write sequence, for example, the word line WLk. The write sequence may be the sequence of word lines which are selected among the word lines WL0 to WLk when the write operation for the memory block BLK is performed. The peripheral circuit 100 may manage one or more word lines which have a higher priority in a write sequence, as "weak word lines." While the word line WL0 will be set as a weak word line in the following descriptions, it is to be noted that a weak word line may vary based on the write sequence of the semiconductor device 10.

As described above, when performing an erase verify operation for the memory block BLK, the peripheral circuit 100 may apply substantially simultaneously the verify voltage Vvrf to all the word lines WL0 to WLk of the memory block BLK. When the verify voltage Vvrf is applied substantially simultaneously to all the word lines WL0 to WLk, for example, the memory cells MC00 to MCk0 included in one string STR0 may operate as one equivalent memory cell. In this case, even though a few of the memory cells MC00 to MCk0 have a higher threshold voltage than the verify voltage Vvrf, the threshold voltage of the equivalent memory cell of the string STR0 may be lower than the verify voltage Vvrf, and the peripheral circuit 100 may determine that the threshold voltages of the memory cells MC00 to MCk0 are lower than the verify voltage Vvrf. As a result, even though the memory cells are incompletely erased, for example, even though the memory cells actually form the threshold voltage distribution E2, the peripheral circuit 100 may determine that the result of the erase verify operation is a 'pass'. An incompletely erased memory cell may cause an error bit when a write operation is performed thereon.

That is, even though the memory cells MC00 to MC0j coupled to the weak word line WL0 have threshold voltages higher than the verify voltage Vvrf because they are seriously degraded and thus are difficult to be erased, the result of the erase verify operation may be determined as a 'pass' as described above. In order to prevent this incorrect determination, the peripheral circuit 100 may perform an additional erase verify operation for the weak word line WL0 as will be described below more in detail.

Figure 7:
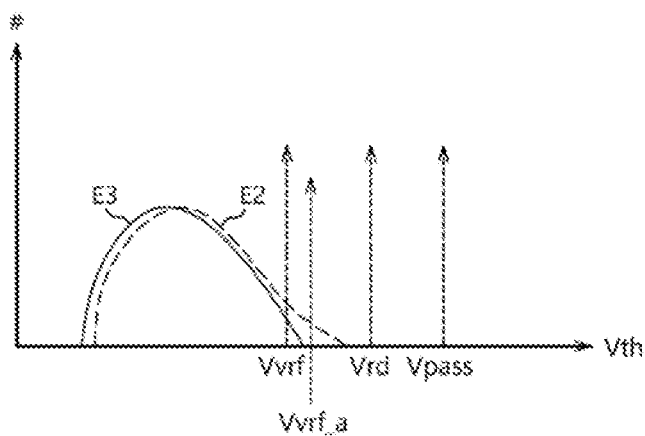
FIG. 7 is a graph illustrating an additional verify voltage and a pass voltage employed for an additional erase verify operation, according to an embodiment of the invention.

FIG. 7 illustrates an additional verify voltage Vvrf_a and a pass voltage Vpass employed when an additional erase verify operation is performed.

Figure 8:
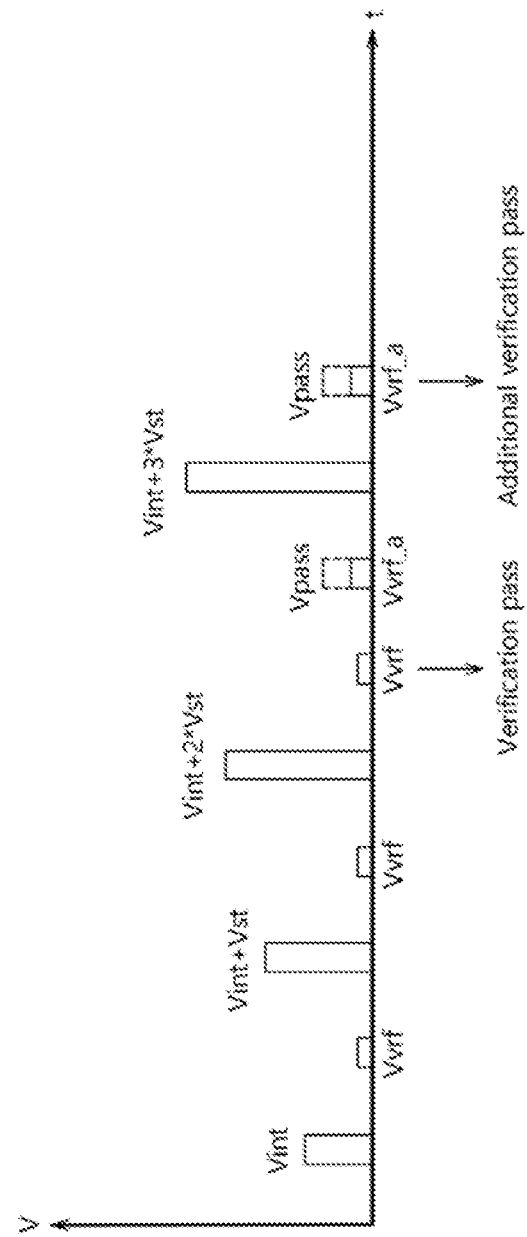
FIG. 8 is a graph illustrating operation voltages employed for an erase operation, an erase verify operation and an additional erase verify operation, according to an embodiment of the invention.

FIG. 8 illustrates operation voltages employed when the erase operation, the erase verify operation and the additional erase verify operation are performed. In the graph of FIG. 8, a horizontal axis t represents time, and a vertical axis V represents voltage.

Hereinbelow, a method for performing an erase operation, an erase verify operation and an additional erase verify operation will be described for example with reference to FIGS. 7 and 8.

After an erase operation is performed according to an ISPE scheme and the result of the erase verify operation is determined to be a 'pass' (that is, a verification pass), the peripheral circuit 100 may perform an additional erase verify operation. When performing the additional erase verify operation, the peripheral circuit 100 may apply the additional verify voltage Vvrf_a to the weak word line WL0, and may apply the pass voltage Vpass to remaining word lines WL1 to WLk except the weak word line WL0. Hence, the peripheral circuit 100 may determine whether threshold voltages of the memory cells MC00 to MC0j coupled to the weak word line WL0 are lower than the additional verify voltage Vvrf_a, based on the on/off characteristics of the memory cells MC00 to MC0j in response to the additional verify voltage Vvrf_a.

As aforementioned, even though the result of the erase verify operation is a 'pass', incompletely erased memory cells may form the threshold voltage distribution E2. In particular, threshold voltages of the memory cells MC00 to MC0j coupled to the weak word line WL0 may be substantially higher than the verify voltage Vvrf. When threshold voltages of the memory cells MC00 to MC0j coupled to the weak word line WL0 are higher than the additional verify voltage Vvrf_a in the additional erase verify operation, the peripheral circuit 100 may determine that the result of the additional erase verify operation is a 'fail'. Until it is determined that the result of the additional erase verify operation is a 'pass' (that is, an additional verification pass), the peripheral circuit 100 may perform the erase operation of applying an increased erase voltage (for example, Vint+3*Vst) to the memory block BLK. When threshold voltages of the memory cells MC00 to MC0j coupled to the weak word line WL0 are lower than the additional verify voltage Vvrf_a, the peripheral circuit 100 may determine that the result of the additional erase verify operation is a 'pass'. For example, when threshold voltages of the memory cells MC00 to MC0j coupled to the weak word line WL0 become lower than the additional verify voltage Vvrf_a through the erase operation, the memory cells of the memory block BLK may form a threshold voltage distribution E3.

According to an embodiment, in the case where the result of the additional erase verify operation is a 'fail' even though the erase operation is iteratively performed till the threshold iteration count, the peripheral circuit 100 may end the erase operation and may process the memory block BLK not to be employed any more.

According to an embodiment, when performing the additional erase verify operation, the peripheral circuit 100 may use the additional verify voltage Vvrf_a having a higher level than the verify voltage Vvrf. Since the weak word line WL0 has already been degraded seriously, in order to cause the memory cells coupled to the weak word line WL0 to have threshold voltages lower than the verify voltage Vvrf, the difficulty of performing the erase operation may increase. Therefore, a verification pass may be further mitigated through the additional verify voltage Vvrf_a having a higher level than the verify voltage Vvrf. Also, in order for memory cells to have threshold voltages which do not cause an error bit even when a write operation is performed, the additional verify voltage Vvrf_a may be set to have a level lower than a read voltage Vrd.

Figure 9:
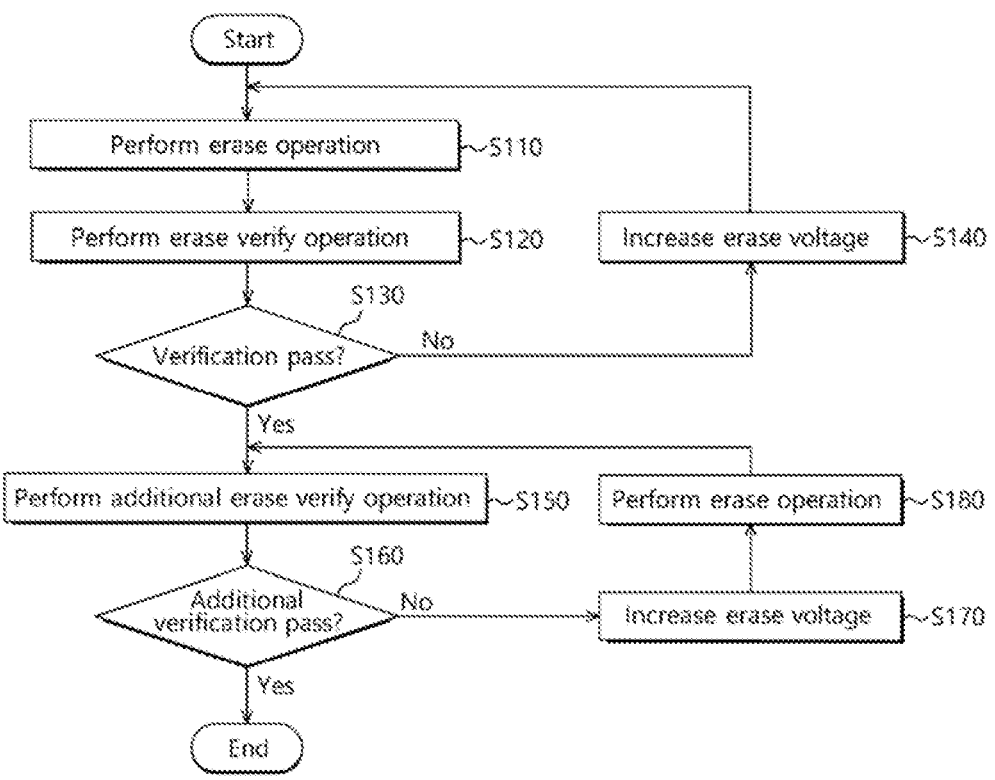
FIG. 9 is a flow chart illustrating a method for operating a semiconductor memory device, according to an embodiment of the invention.

FIG. 9 is a flow chart illustrating a method for operating the semiconductor device 10 shown in FIG. 1, according to an embodiment of the Invention. Referring to FIG. 9, there is shown a method for the semiconductor device 10 to perform an erase operation, an erase verify operation and an additional erase verify operation for one memory block BLK of the memory region.

Accordingly, at step S110, the peripheral circuit 100 may perform the erase operation for the memory block BLK. The voltage supply unit 120 may apply the initial erase voltage Vint to the memory block BLK and supply the erase permission voltage to the address decoder 140, under the control of the control logic 110. The address decoder 140 may apply the erase permission voltage to the word lines WL0 to WLk of the memory block BLK.

At step S120, the peripheral circuit 100 may perform the erase verify operation for the memory block BLK. The voltage supply unit 120 may supply the verify voltage Vvrf to the address decoder 140. The address decoder 140 may apply the verify voltage Vvrf substantially simultaneously to the word lines WL0 to WLk of the memory block BLK. The memory cells included in the memory block BLK may be turned on/off in response to the verify voltage Vvrf.

At step S130, the peripheral circuit 100 may determine whether the result of the erase verify operation is a 'pass.' The control logic 110 may determine the result of the erase verify operation, based on current produced as the memory cells included in the memory block BLK are turned on/off in response to the verify voltage Vvrf. In the case where the result of the erase verify operation is a 'fail', the process may proceed to step S140.

At step S140, the peripheral circuit 100 may increase the erase voltage employed in the immediately previous erase operation, by the step voltage Vst. The control logic 110 may control the voltage supply unit 120 to increase the erase voltage. Then, at step S110, the peripheral circuit 100 may perform the erase operation for the memory block BLK, by using the increased erase voltage. For example, until it is determined that the result of the erase verify operation is a 'pass', the peripheral circuit 100 may iteratively perform the erase operation by increasing the erase voltage.

At step S130, in the case where the result of the erase verify operation is a 'pass', the process may proceed to step S150. At step S150, the peripheral circuit 100 may perform the additional erase verify operation for the weak word line WL0 of the memory block BLK. The voltage supply unit 120 may supply the additional verify voltage Vvrf_a and the pass voltage Vpass to the address decoder 140. The address decoder 140 may apply the additional verify voltage Vvrf_a to the weak word line WL0, and may apply the pass voltage Vpass to the remaining word lines WL1 to WLk. The memory cells included in the memory block BLK may be turned on/off in response to the additional verify voltage Vvrf_a and the pass voltage Vpass.

At step S160, it may be determined whether the result of the additional erase verify operation is a 'pass.' The control logic 110 may determine the result of the additional erase verify operation, based on current produced as the memory cells MC00 to MC0j coupled to the weak word line WL0 are turned on/off in response to the additional verify voltage Vvrf_a and the memory cells coupled to the remaining word lines WL1 to WLk are turned on in response to the pass voltage Vpass. In the case where the result of the additional erase verify operation is a 'pass', the process may be ended. In the case where the result of the additional erase verify operation is a 'fail', the process may proceed to step S170.

At step S170, the peripheral circuit 100 may increase the erase voltage employed in the immediately previous erase operation, by the step voltage Vst. The control logic 110 may control the voltage supply unit 120 to increase the erase voltage.

At step S180, the peripheral circuit 100 may perform the erase operation for the memory block BLK, by using the increased erase voltage. Then, at step S150, the peripheral circuit 100 may perform the additional erase verify operation for the weak word line WL0. Until it is determined that the result of the additional erase verify operation is a 'pass', the peripheral circuit 100 may iteratively perform the erase operation by increasing the erase voltage each time.

Figure 10:
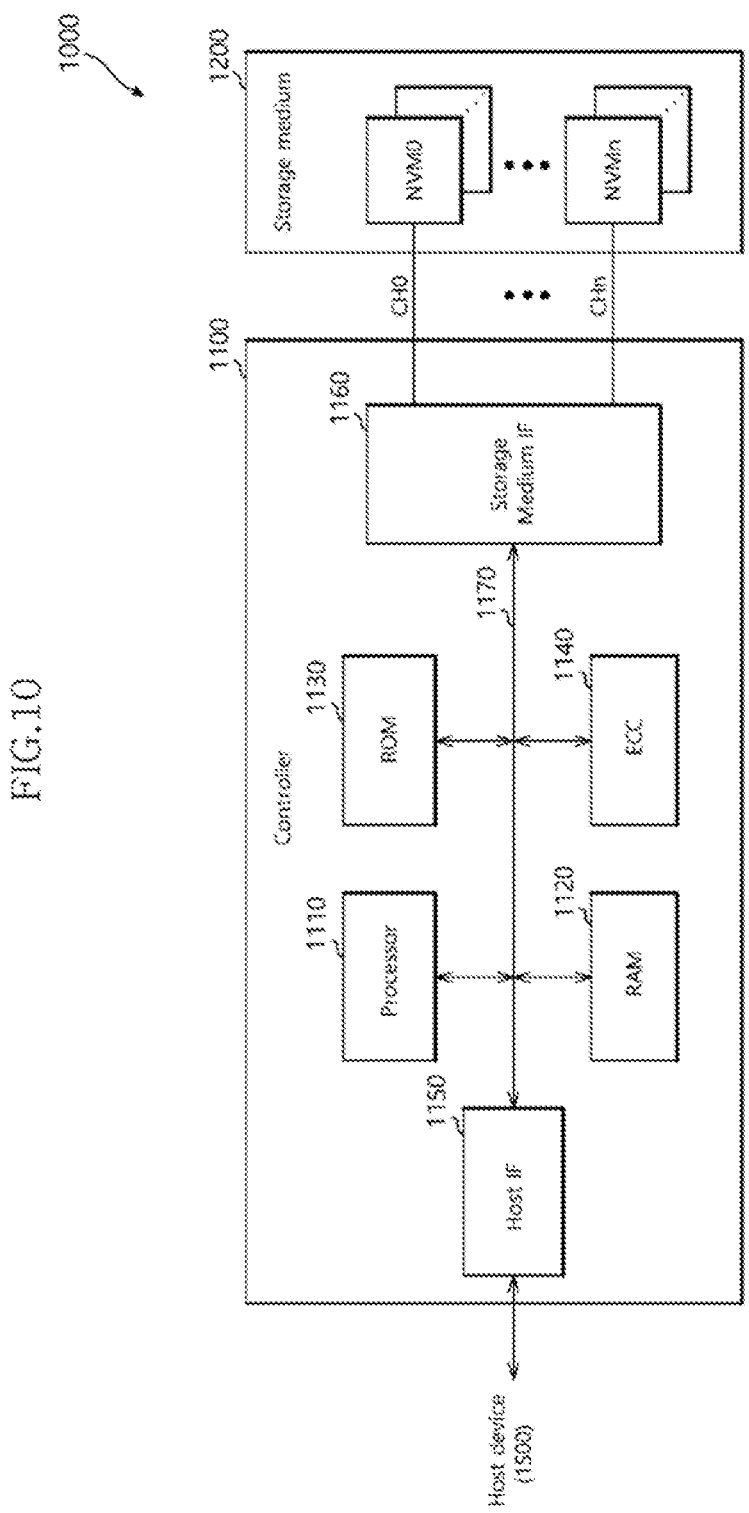
FIG. 10 is a block diagram illustrating a data storage device 1000, according to an embodiment of the Invention.

FIG. 10 is a block diagram illustrating a data storage device 1000, according to an embodiment of the invention.

The data storage device 1000 may be configured to store data provided from a host device 1500 in response to a write request from the host device 1500. Also, the data storage device 1000 may be configured to provide stored data to the host device 1500 in response to a read request from the host device 1500. The data storage device 1000 may be embedded in the host device 1500. The data storage device 1000 may be manufactured separately and operatively coupled to the host device 1500.

The data storage device 1000 may be or comprise a personal computer memory card international association (PCMCIA) card, a compact flash (CF) card, a smart media card, a memory stick, a multimedia card in the form of an MMC, an eMMC, an RS-MMC and an MMC-micro, a secure digital card in the form of an SD, a mini-SD and a micro-SD, a universal flash storage (UFS), a solid state drive (SSD), and the like.

The data storage device 1000 may include a controller 1100 and a storage medium 1200.

The controller 1100 may control data exchange between the host device 1500 and the storage medium 1200. The controller 1100 may include a processor 1110, a RAM 1120, a ROM 1130, an ECC unit 1140, a host interface 1150, and a storage medium interface 1160.

The processor 1110 may control the general operations of the controller 1100. The processor 1110 may store data in the storage medium 1200 and read stored data from the storage medium 1200, based on data processing requests from the host device 1500 such as a write request and a read request. In order to efficiently manage the storage medium 1200, the processor 1110 may control internal operations of the data storage device 1000 such as a merge operation, a wear leveling operation, and so forth.

The RAM 1120 may store programs and program data to be employed by the processor 1110. The RAM 1120 may temporarily store data transmitted from the host interface 1150 before transferring it to the storage medium 1200. The RAM 1120 may temporarily store data transmitted from the storage medium 1200 before transferring it to the host device 1500.

The ROM 1130 may store program codes to be read by the processor 1110. The program codes may include commands to be processed by the processor 1110, in order for the processor 1110 to control the Internal units of the controller 1100.

The ECC unit 1140 may encode data to be stored in the storage medium 1200, and may decode data read from the storage medium 1200. The ECC unit 1140 may detect and correct an error having occurred in data, according to an ECC algorithm.

The host interface 1150 may exchange data processing requests, data, and the like with the host device 1500.

The storage medium interface 1160 may transmit control signals and data to the storage medium 1200. The storage medium interface 1160 may receive data from the storage medium 1200. The storage medium interface 1160 may be coupled with the storage medium 1200 through a plurality of channels CH0 to CHn.

The storage medium 1200 may include a plurality of nonvolatile memory devices NVM0 to NVMn. Each of the plurality of nonvolatile memory devices NVM0 to NVMn may operate under the control of the controller 1100. Each of the plurality of nonvolatile memory devices NVM0 to NVMn, like the semiconductor device 10 shown in FIG. 1, may perform an erase operation for its memory block in response to an erase command transmitted from the controller 1100 and then, may perform an erase verify operation and perform an additional erase verify operation for a weak word line based on the result of the erase verify operation.

Figure 11:
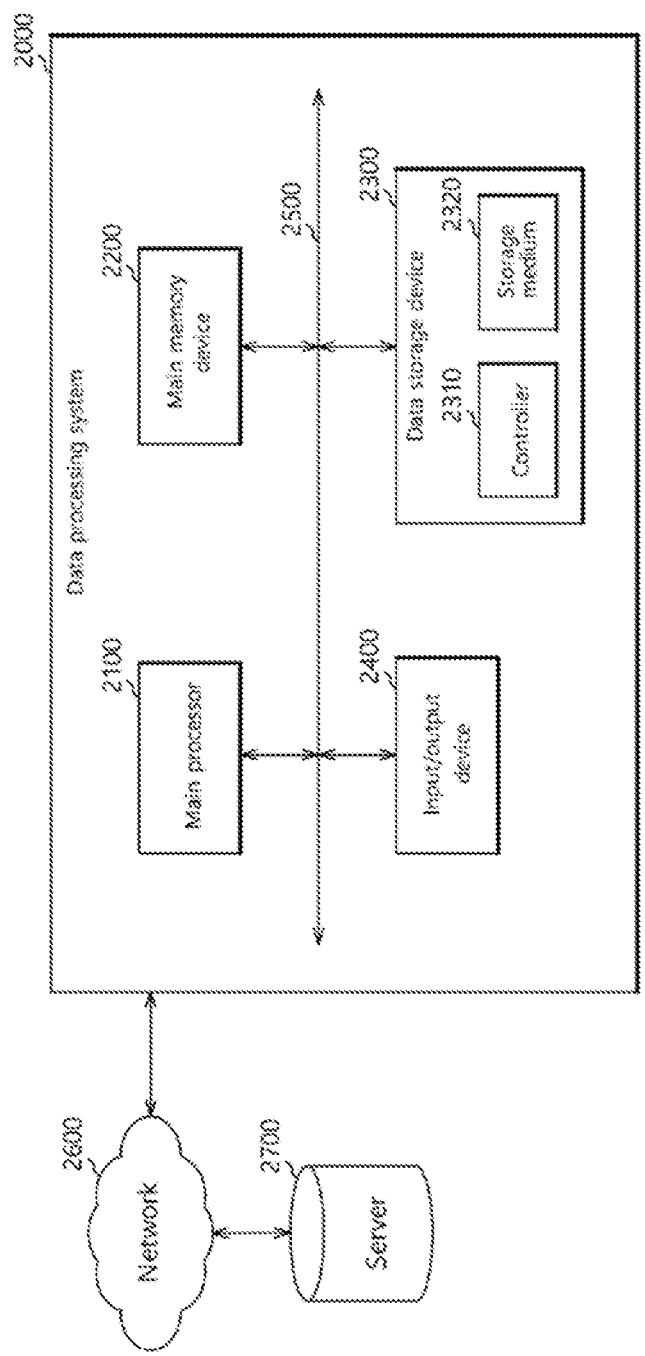
FIG. 11 is a block diagram illustrating a data processing system 2000, according to an embodiment of the invention.

FIG. 11 is a block diagram illustrating a data processing system 2000, according to an embodiment of the invention.

The data processing system 2000 may include a computer, a laptop, a netbook, a smart phone, a digital TV, a digital camera, a navigator, and the like. The data processing system 2000 may include a main processor 2100, a main memory device 2200, a data storage device 2300, and an Input/output device 2400. The internal units of the data processing system 2000 may exchange data, control signals, and the like through a system bus 2500.

The main processor 2100 may control the general operations of the data processing system 2000. The main processor 2100 may be, for example, a central processing unit such as a microprocessor. The main processor 2100 may execute software such as an operation system, an application, a device driver, and the like, on the main memory device 2200.

The main memory device 2200 may store programs and program data to be employed by the main processor 2100. The main memory device 2200 may temporarily store data to be transmitted to the data storage device 2300 and the input/output device 2400.

The data storage device 2300 may include a controller 2310 and a storage medium 2320. The data storage device 2300 may be configured and operate in a substantially similar way as the data storage device 1000 shown in FIG. 10. The storage medium 2320 may include the semiconductor device 10 of FIG. 1.

The input/output device 2400 may include a monitor, a keyboard, a scanner, a touch screen, a mouse, and the like, capable of exchanging data with a user. The input/output device 2400 may receive a command for controlling the data processing system 2000 from the user or provide a processed result to the user.

According to an embodiment, the data processing system 2000 may communicate with a server 2700 through a network 2600 such as a LAN (local area network), a WAN (wide area network), a wireless network, and so on. The data processing system 2000 may include a network interface (not shown) to access the network 2600.

While various embodiments have been described above, it will be understood to those skilled in the art that the described embodiments are mere examples of the invention and that the invention is not intended to be limited to the described embodiments only. Many other embodiments and variations of the invention will be envisioned by those skilled in the art after having read the present disclosure without departing from the scope and spirit of the invention as defined by the appended claims.

What is claimed is:

1. A semiconductor device comprising:
a memory block including a plurality of memory cells coupled with a plurality of corresponding word lines; and
a peripheral circuit suitable for performing a first erase verify operation for the plurality of word lines, and a second erase verify operation for one or more weak word lines among the plurality of word lines based on a result of the first erase verify operation,
wherein the peripheral circuit performs the second erase verify operation using a second verify voltage higher than a first verify voltage employed for the first erase verify operation.

2. The semiconductor device according to claim 1, wherein, when performing the first erase verify operation, the peripheral circuit applies the first verify voltage substantially simultaneously to the plurality of word lines to determine whether the memory cells have threshold voltages lower than the first verify voltage.

3. The semiconductor device according to claim 1, wherein, when performing the second erase verify operation, the peripheral circuit applies the second verify voltage to the one or more weak word lines and applies a pass voltage to the remaining word lines to determine whether memory cells coupled to the one or more weak word lines have threshold voltages lower than the second verify voltage.

4. The semiconductor device according to claim 1, wherein the peripheral circuit performs the second erase verify operation when the memory block is verified as being erased based on the result of the first erase verify operation.

5. The semiconductor device according to claim 1, wherein the peripheral circuit performs an erase operation for the memory block when the memory block is verified as failing to be erased based on the result of the first erase verify operation or a result of the second erase verify operation.

6. The semiconductor device according to claim 1, wherein the one or more weak word lines are set based on a write sequence of a write operation for the plurality of the word lines.

7. A method for operating a semiconductor device including a memory block including a plurality of memory cells, the method comprising:
performing a first erase verify operation for a plurality of word lines coupled to the plurality of corresponding memory cells; and
performing a second erase verify operation for one or more weak word lines among the plurality of word lines based on a result of the first erase verify operation,
wherein the second erase verify operation is performed by using a second verify voltage higher than a first verify voltage employed in the first erase verify operation.

8. The method according to claim 7, wherein the performing of the first erase verify operation includes:
applying the first verify voltage substantially simultaneously to the plurality of the word lines; and
determining whether the plurality of memory cells have threshold voltages lower than the first verify voltage.

9. The method according to claim 7, wherein the performing of the second erase verify operation includes:
applying the second verify voltage to the one or more weak word lines and applying a pass voltage to the remaining word lines; and
determining whether memory cells coupled to the one or more weak word lines have threshold voltages lower than the second verify voltage.

10. The method according to claim 7, wherein the second erase verify operation is performed when the memory block is verified as being erased based on the result of the first erase verify operation.

11. The method according to claim 7, further comprising:
performing an erase operation for the memory block when the memory block is verified as failing to be erased based on the result of the first erase verify operation or a result of the second erase verify operation.

12. A data storage device comprising:
a nonvolatile memory device including a plurality of memory blocks and a peripheral circuit, each of the memory blocks including a plurality of memory cells which are coupled with a plurality of corresponding word lines; and
a controller suitable for transmitting an erase command for a memory block selected among the memory blocks, to the nonvolatile memory device,
wherein in response to the erase command, the peripheral circuit performs an erase operation for the selected memory block, performs a first erase verify operation for the plurality of word lines of the selected memory block, and performs a second erase verify operation for one or more weak word lines of the selected memory block based on a result of the first erase verify operation, and
wherein the peripheral circuit performs the second erase verify operation using a second verify voltage higher than a first verify voltage employed for the first erase verify operation.

13. The data storage device according to claim 12, wherein when performing the first erase verify operation, the peripheral circuit applies the first verify voltage substantially simultaneously to the word lines of the selected memory block to determine whether memory cells of the selected memory block have threshold voltages lower than the first verify voltage.

14. The data storage device according to claim 12, wherein when performing the second erase verify operation, the peripheral circuit applies the second verify voltage to the weak word line and applies a pass voltage to remaining word lines of the selected memory block to determine whether memory cells coupled to the one or more weak word lines have threshold voltages lower than the second verify voltage.

15. The semiconductor device according to claim 12, wherein the peripheral circuit performs the second erase verify operation when the memory block is verified as being erased based on the result of the first erase verify operation.

16. The data storage device according to claim 12, wherein when the selected memory block is verified as failing to be erased based on the result of the first erase verify operation or a result of the second erase verify operation, the peripheral circuit increases an erase voltage which is employed in a previous erase operation for the selected memory block, and performs the erase operation by using the increased erase voltage.

17. The data storage device according to claim 12, wherein the peripheral circuit iteratively performs the erase operation till a threshold iteration count is reached, based on the result of the first erase verify operation or a result of the second erase verify operation.

* * * * *